(12) United States Patent
Yu

(10) Patent No.: US 12,499,808 B2
(45) Date of Patent: Dec. 16, 2025

(54) SOURCE DRIVE INTEGRATED CIRCUIT AND DISPLAY DEVICE INCLUDING THE SAME

(71) Applicant: LX SEMICON CO., LTD., Daejeon (KR)

(72) Inventor: Jin Young Yu, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 18/910,199

(22) Filed: Oct. 9, 2024

(65) Prior Publication Data

US 2025/0118242 A1  Apr. 10, 2025

(30) Foreign Application Priority Data

Oct. 10, 2023  (KR) .................. 10-2023-0134239

(51) Int. Cl.
*G09G 5/00* (2006.01)
*G09G 3/20* (2006.01)
*H10D 86/40* (2025.01)
*H10D 86/60* (2025.01)

(52) U.S. Cl.
CPC ......... *G09G 3/2092* (2013.01); *H10D 86/441* (2025.01); *H10D 86/60* (2025.01)

(58) Field of Classification Search
CPC .. G09G 3/2092; G09G 3/3275; G09G 3/3611; G09G 3/3688; G09G 5/006; G09G 2300/0426; G09G 2310/027; G09G 2310/0291; G09G 2310/08; G09G 2370/08; H10D 86/441
See application file for complete search history.

(56) References Cited

U.S. PATENT DOCUMENTS

2004/0212578 A1  10/2004  Itou et al.
2005/0168426 A1  8/2005  Moon et al.
2008/0278428 A1  11/2008  Song et al.
(Continued)

FOREIGN PATENT DOCUMENTS

KR  10-2014-0141479 A  12/2014
KR  10-2016-0042496 A  4/2016
(Continued)

OTHER PUBLICATIONS

Extended European Search Report dated Mar. 17, 2025, issued for the corresponding European patent application No. 24205355.1, 17 pages.

*Primary Examiner* — Joe H Cheng
(74) *Attorney, Agent, or Firm* — ROTHWELL, FIGG, ERNST & MANBECK, P.C.

(57) ABSTRACT

A source drive integrated circuit (IC) includes: one or more digital circuit parts configured to receive a digital signal; a plurality of signal wires connected to the digital circuit parts and configured to transmit the digital signal to the digital circuit parts; and a clock wire connected to the digital circuit parts and configured to transmit a clock to the digital circuit parts. Each of the signal wires and the clock wire includes: an input wire located at the center in the length direction of the digital circuit parts; and branch wires branching off to both sides of the input wire along the length direction of the digital circuit parts.

15 Claims, 10 Drawing Sheets

(56) References Cited

U.S. PATENT DOCUMENTS

| | | | | |
|---|---|---|---|---|
| 2011/0037758 A1* | 2/2011 | Lim | ............... | H03L 7/0805 |
| | | | | 345/213 |
| 2016/0189595 A1* | 6/2016 | Choi | ............... | G09G 3/3275 |
| | | | | 345/212 |
| 2020/0074935 A1* | 3/2020 | Wang | ............... | G09G 3/3291 |

FOREIGN PATENT DOCUMENTS

| | | |
|---|---|---|
| KR | 10-2019-0072125 A | 6/2019 |
| KR | 10-2023-0001623 A | 1/2023 |

\* cited by examiner

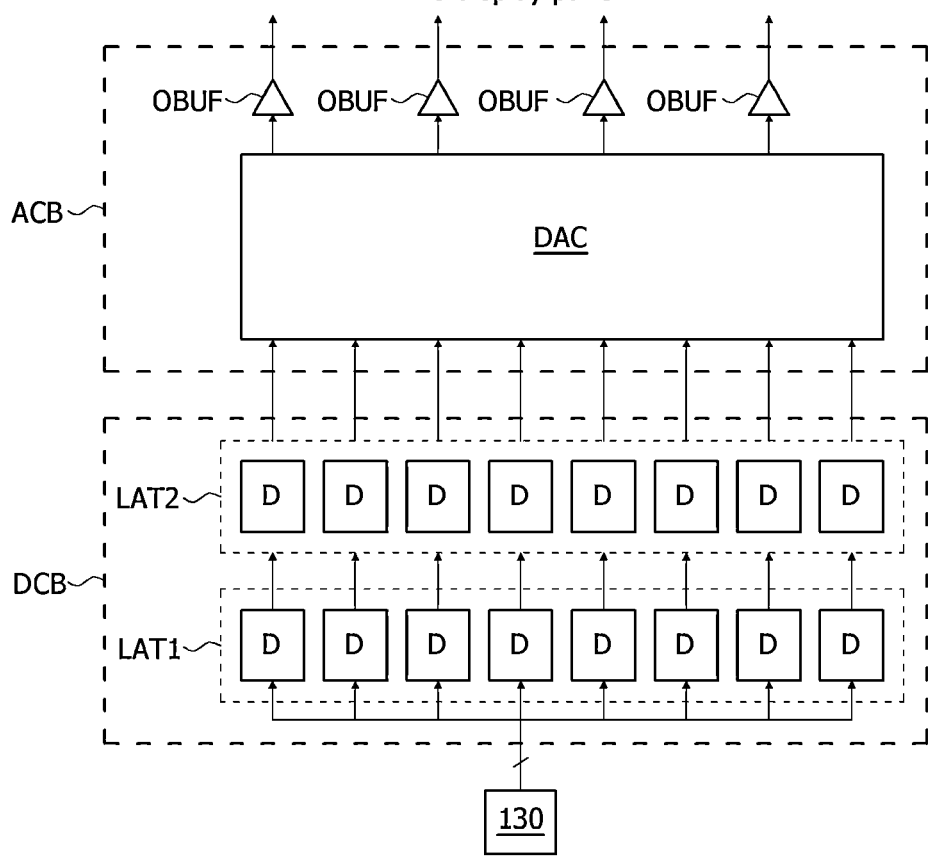

SOURCE DRIVE INTEGRATED CIRCUIT AND DISPLAY DEVICE INCLUDING THE SAME

CROSS-REFERENCE TO RELATED APPLICATION

This application claims priority to and the benefit of Korean Patent Application No. 10-2023-0134239, filed on Oct. 10, 2023, the disclosure of which is incorporated herein by reference in its entirety.

BACKGROUND

Field

The present disclosure relates to a source drive integrated circuit (IC) and a display device including the same.

Description of Related Art

A variety of flat panel displays are known, including electroluminescence displays (ELD) such as liquid crystal displays (LCD) and organic light-emitting diode (OLED) displays, field emission displays (FED), plasma display panels (PDP), and electrophoresis displays (EPD).

A display device includes a display panel having pixels arranged therein that display an input image, and a display panel driving circuit that writes data to the pixels in the display panel. The display panel driving circuit includes a data driver that supplies data signals to data lines on the display panel. The data driver is integrated into a source drive integrated circuit (IC) and electrically connected to the data lines on the display panel. Wires through which the data signals are transmitted, digital circuit parts, analog circuit parts, and the like are integrated at a high density in the source drive IC.

Voltage drop of the digital signals may occur due to thin and long wires through which the digital signals are transmitted in the source drive IC. The voltage drop may become larger when the voltage of the digital signals input to the source drive IC is subjected to a transition.

SUMMARY

The present disclosure provides a source drive IC capable of reducing a voltage drop of digital signals, and a display device including the same.

A source drive integrated circuit (IC) according to one or more example embodiments of the present disclosure includes one or more digital circuit parts configured to receive a digital signal; a plurality of signal wires connected to the digital circuit parts and configured to transmit the digital signal to the digital circuit parts; and a clock wire connected to the digital circuit parts and configured to transmit a clock to the digital circuit parts.

Each of the signal wires and the clock wire includes an input wire located at the center in the length direction of the digital circuit parts; and branch wires branching off to both sides of the input wire along the length direction of the digital circuit parts.

The source drive IC may further include a plurality of buffers connected in series at equal intervals to each of the signal wires and the clock wire.

The buffers may be arranged in bilateral symmetry on the branch wires based on the input wire.

The source drive IC may further include a plurality of flip-flops connected to each of the signal wires; and a delay circuit connected to a clock terminal of at least one of the flip-flops.

The source drive IC may further include a buffer connected between the flip-flops.

The source drive IC may further include a first flip-flop connected to a first signal wire; a first delay circuit connected to a clock terminal of the first flip-flop; a second flip-flop connected to a second signal wire; and a second delay circuit connected to a clock terminal of the second flip-flop. A delay value of the first delay circuit may be different from a delay value of the second delay circuit.

In each of the signal wires, a distance between the buffers connected to neighboring wires may be smaller than a distance between the buffers connected in series to one wire.

A display device according to one or more example embodiments of the present disclosure includes the source drive IC.

According to the present disclosure, the voltage drop of the digital signal may be reduced by arranging the buffers at equal intervals on the wires through which the digital signal and the clock are transmitted in the source drive IC chip.

According to the present disclosure, the voltage drop of the digital signal may be reduced by connecting the input wires through which the digital signals and the clock are input to the center of the digital circuit parts in the source drive IC chip.

According to the present disclosure, the voltage drop of the digital signal may be further reduced by spreading the transition or toggle timing of the digital signal input to each of the digital circuit parts in the source drive IC on a time axis.

The effects of the present disclosure are not limited to the above-mentioned effects, and other effects that are not mentioned will be apparently understood by those skilled in the art from the following description and the appended claims.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which:

FIG. 3 is a block diagram illustrating one example of the source blocks shown in FIG. 2;

DETAILED DESCRIPTION OF EXEMPLARY EMBODIMENTS

Figure 1:
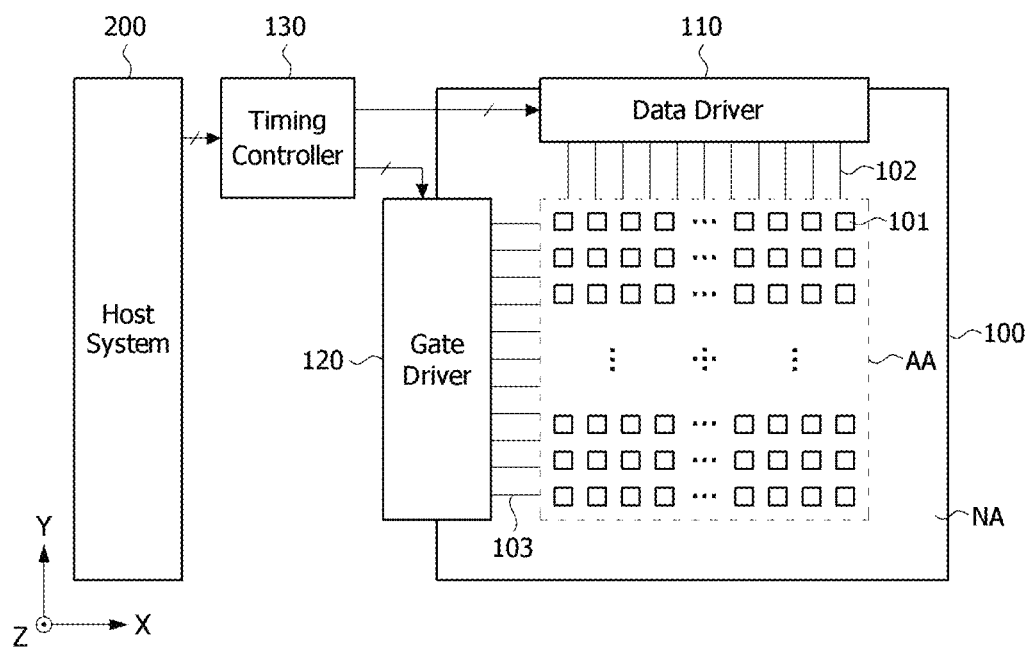
FIG. 1 is a block diagram illustrating a display device according to one embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "comprising" used herein are generally intended to allow other components to be added unless the terms are used with the term "only." Any references to singular may include plural unless expressly stated otherwise.

Components are interpreted to include an ordinary error range even if not expressly stated.

The terms "first," "second," and the like may be used to distinguish elements from each other, but the functions or structures of the components are not limited by ordinal numbers or component names in front of the components.

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings.

FIG. 1 is a block diagram illustrating a display device according to one embodiment of the present disclosure.

Referring to FIG. 1, the display device according to the embodiment of the present disclosure includes a display panel 100 and a display panel driving circuit for writing pixel data to pixels in the display panel 100.

A substrate of the display panel 100 may be, but is not limited to, a plastic substrate, a thin glass substrate, or a metal substrate. The display panel 100 may be, but is not limited to, a panel having a rectangular structure with a length in a first direction, a width in a second direction, and a thickness in a third direction. X, Y, and Z in FIG. 1 may be a first direction, a second direction, and a third direction, respectively. At least a portion of the display panel 100 may have a curved outer periphery.

The display panel 100 may be implemented as a non-transmissive display panel or a transmissive display panel. The transmissive display panel may be applied to a transparent display device in which an image is displayed on a screen and an actual object in the background is visible. The display panel 100 may be made as a flexible display panel.

In the case of a liquid crystal display device, a back light unit (BLU) may be disposed below the display panel 100. In the case of a self-emitting display device such as an electroluminescent display device, a separate light source such as a backlight unit is not required.

A display area AA of the display panel 100 includes a pixel array for displaying an input image thereon. The pixel array includes a plurality of data lines 102, a plurality of gate lines 103 intersecting the data lines 102, and the pixels 101 connected to the data lines 102 and the gate lines 103.

Each of the pixels 101 may be divided into a red sub-pixel, a green sub-pixel, and a blue sub-pixel for color implementation. Each of the pixels may further include a white sub-pixel. In a liquid crystal display device, the pixels include a liquid crystal cell. In an electroluminescent display, each of the pixels includes a light-emitting element such as OLED, inorganic LED, etc., and pixel circuit to drive the light-emitting element. Each of the pixel circuits is connected to the data lines, the gate lines, and the power lines. In the following, "pixel" may be interpreted as "sub-pixel".

The display panel driving circuit writes the pixel data of the input image to the pixels in the display panel 100 under the control of a timing controller 130. The display panel driving circuit includes a data driver 110 and a gate driver 120.

The display panel driving circuit may further include a touch sensor driver for driving touch sensors. The touch sensor driver is omitted from FIG. 1. In mobile devices or wearable devices, the timing controller 130, the data driver 110, the touch sensor deriver, and the like may be integrated into one drive IC.

Figure 2:
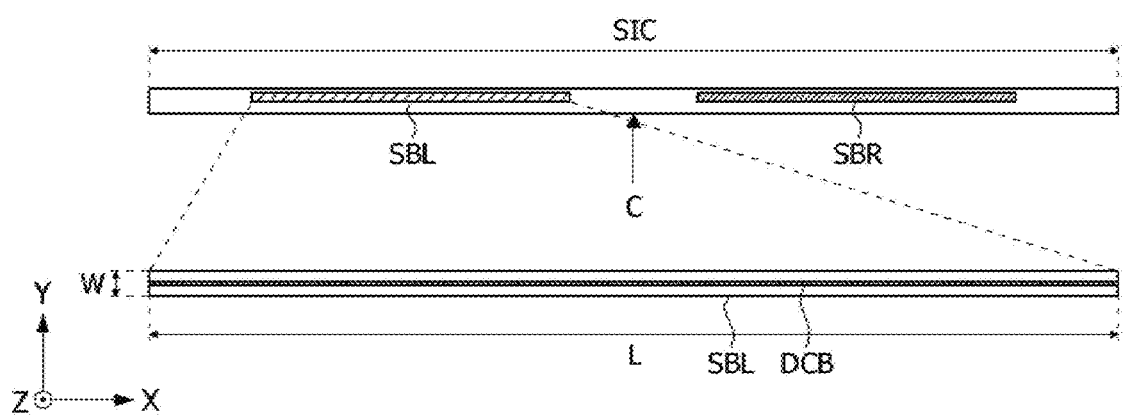
FIG. 2 is a plan view schematically illustrating a source drive IC chip.

The data driver 110 receives the pixel data of the input image provided as a digital signal from the timing controller 130 and outputs data voltage of the pixel data. The data driver 110 converts the pixel data of the input image into a gamma compensation voltage using a digital-to-analog converter (DAC) to output the data voltage. A gamma reference voltage is divided into the gamma compensation voltage for each grayscale by a voltage divider circuit in the data driver 110 and is supplied to the DAC. The DAC generates the data voltage as the gamma compensation voltage corresponding to a grayscale value of the pixel data. The data voltage output from the DAC is output to the data line 102 through an output buffer in each of the data output channels of the data driver 110. The data driver 110 may be integrated into a drive integrated circuit (IC) chip as shown in FIG. 2.

A circuit of the gate driver 120 may be disposed in a non-display area NA outside the display area AA in the display panel 100 or at least a portion thereof may be disposed in the display area AA. The gate driver 120 may be integrated into a separate gate drive IC and electrically connected to the gate lines 103 on the display panel 100.

The gate driver 120 sequentially outputs pulses of the gate signals to the gate lines 103 under the control of the timing controller 130. The gate driver 120 may sequentially supply the pulses of the gate signals to the gate lines 103 by shifting the pulses of the gate signals using shift registers.

The timing controller 130 receives the pixel data of the input image and a timing signal synchronized with the pixel data from an external host system 200. The timing signal may include a vertical synchronization signal Vsync, a horizontal synchronization signal Hsync, a data enable signal DE, and a main clock. A vertical period and a horizontal period may be known by counting the data enable signal DE, and thus the vertical synchronization signal Vsync and the horizontal synchronization signal Hsync may be omitted. The vertical synchronization signal Vsync has a cycle of one frame period. The horizontal synchronization signal Hsync and the data enable signal DE have a cycle of one horizontal period (1H).

The timing controller 130 controls the operation timing of the display panel driving circuits 110 and 120 based on the timing signals such as Vsync, Hsync, and DE received from the host system 200.

The host system 200 may scale an image signal from a video source to match the resolution of the display panel 100, and may transmit it to the timing controller 130 together with the timing control signal. In a mobile system, the host system 200 may be implemented by an application processor (AP). The host system 200 may transmit the pixel data of the input image to the drive IC through a mobile Industry Processor Interface (MIPI). The host system 200 may be electrically connected to the drive IC through a flexible printed circuit, for example, a flexible printed circuit (FPC). The drive IC may be bonded to the display panel 100 in a COG (Chip on Glass) process. The drive IC may be a chip on film (COF) mounted on a flexible circuit film. The COF may be bonded to data pads disposed on the non-display area of the display panel 100 in a bonding process and electrically connected to the data lines on the display panel 100.

FIG. 2 is a plan view schematically illustrating the source drive IC chip.

Referring to FIG. 2, the source drive IC chip SIC has a length (L) in the first direction, a width (W) in the second direction, and a thickness in the third direction.

An input port may be disposed on at least one of the four sides of the source drive IC chip SIC. The digital signal and the clock transmitted from the timing controller 130 may be received by the source drive IC chip SIC through the input port.

The source drive IC chip SIC may include first and second source blocks SBL and SBR. Each of the source blocks SBL and SBR receives the digital signal and the clock, converts them to analog voltages, and outputs the analog voltages. The first source block SBL may be disposed on one side (or left side) of the source drive IC chip SIC when viewed from the center C of the length in the first direction of the source drive IC chip SIC. The second source block SBR may be disposed on the other side (or right side) of the source drive IC chip SIC when viewed from the center C of the length in the first direction of the source drive IC chip SIC. The first source block SBL and the second source block SBR may be spaced apart from each other by a predetermined distance.

Each of the first and second source blocks SBL and SBR includes a digital circuit part DCB that receives and latches the digital signal, and an analog circuit part ACB in FIG. 3 that converts the digital signal received from the digital circuit part DCB to the analog voltage to output the data voltage. The source drive IC chip SIC may further include a memory disposed in proximity to the first and second source blocks SBL and SBR. The memory may be, but is not limited to, a frame memory, which stores data in the amount of one frame.

FIG. 3 is a block diagram illustrating one example of the source blocks shown in FIG. 2.

Referring to FIG. 3, the digital circuit part DCB of each of the source blocks SBL and SBR may include a first latch LAT1 and a second latch LAT2.

The first latch LAT1 samples and sequentially latches the digital signal received in series from the timing controller 130 at a clock timing synchronized with the digital signal and passes it to the second latch LAT2. The second latch LAT2 simultaneously outputs the digital signal received from the first latch LAT1 in response to an output enable clock. The first and second latches LAT1 and LAT2 convert the pixel data received in serial to pixel data in a parallel scheme by sequentially latching the digital signal. Each of the source blocks SBL and SBR may further include a shift register connected to an input end of the first latch LAT1.

The analog circuit part ACB of each of the source blocks SBL and SBR includes a DAC connected to an output end of the second latch LAT2 and an output buffer OBUF. The DAC converts the pixel data received from the second latch LAT2 to the gamma compensation voltage and outputs the data voltage of the pixel data. The data voltage output from the DAC may be output through the output buffer OBUF in each of the channels of the source drive IC chip SIC and fed to the data lines 102 on the display panel 100.

Figure 4A:
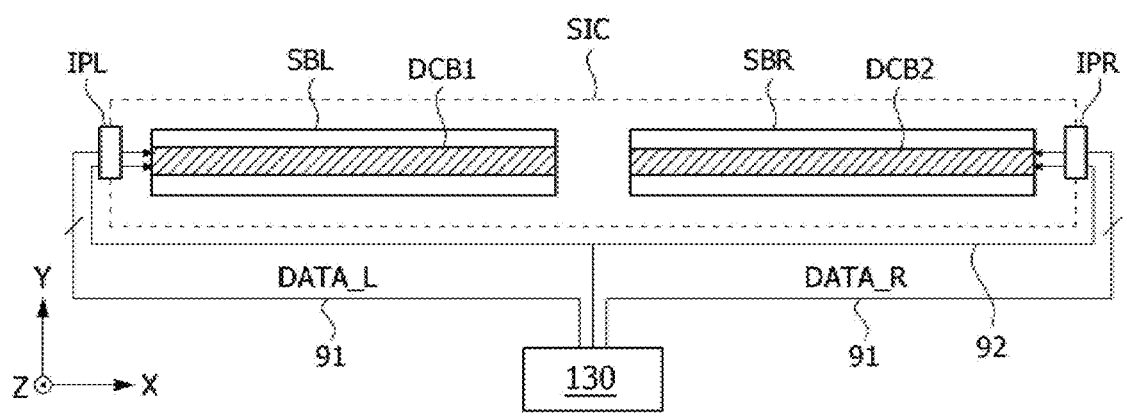
FIGS. 4A and 4B are diagrams illustrating an input port of a source drive IC chip according to one embodiment of the present disclosure.
Figure 4B:
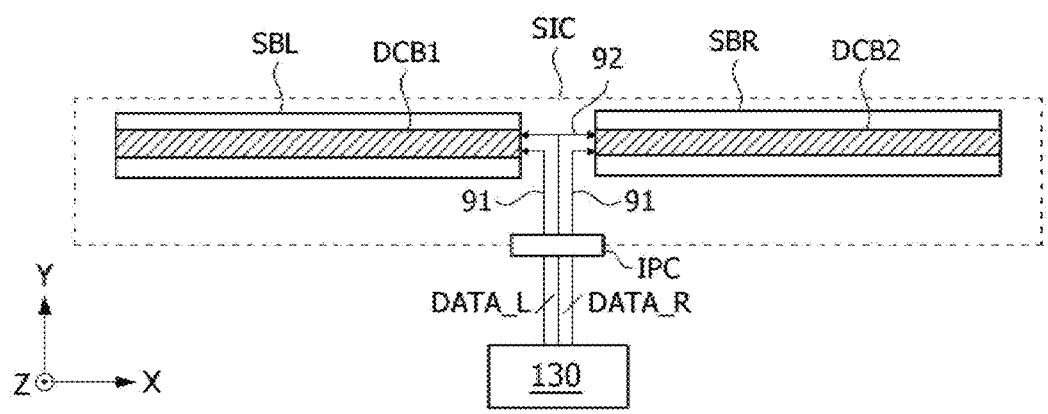

FIGS. 4A and 4B are diagrams illustrating an input port of a source drive IC chip according to one embodiment of the present disclosure.

Referring to FIG. 4A, the source drive IC chip SIC may include first and second input ports IPL and IPR arranged on both surfaces in the second direction Y. A signal wire 91 and a clock wire 92 may be connected to first and second digital circuit parts DCB1 and DCB2 through the input ports IPL and IPR of the source drive chip SIC. The digital signal is transmitted through the signal wire 91, and the clock is transmitted through the clock wire 92. To synchronize the first and second digital circuit parts DCB1 and DCB2 with each other, the clock wire 92 may be connected by a common wire to the digital circuit parts DCB1 and DCB2, but is not limited thereto.

In the first source block SBL, the first digital circuit part DCB1 starts to sequentially receive a first digital signal DATA_L and the clock from a left end cell in the first digital circuit part DCB1 through the first input port IPL located on the left side of the source drive IC chip SIC to receive the first digital signal DATA_L and the clock up to a right end cell in the first digital circuit part DCB1. In the second source block SBR, the second digital circuit part DCB2 starts to sequentially receive a second digital signal DATA_R and the clock from a right end cell in the second digital circuit part DCB2 through the second input port IPR located on the right side of the source drive IC chip SIC to receive the second digital signal DATA_R and the clock up to the left end cell in the second digital circuit part DCB2.

The input ports of the source drive IC chip SIC are not limited to those shown in FIG. 4A. As an example, the input ports of the source drive IC chip SIC may be arranged on at least one side in the first direction X of the source drive IC chip SIC, as shown in FIG. 4B.

Referring to FIG. 4B, the source drive IC chip SIC may include an input port IPC located at the center of the length in the first direction X. The signal wire 91 and the clock wire 92 may be connected to the first and second digital circuit parts DCB1 and DCB2 through the input port IPC of the source drive chip SIC.

In the first source block SBL, the first digital circuit part DCB1 starts to sequentially receive the first digital signal DATA_L and the clock from a right end cell in the first digital circuit part DCB1 through the input port IPC to receive the first digital signal DATA_L and the clock up to an left end cell of the first digital circuit part DCB1. In the second source block SBR, the second digital circuit part DCB2 starts to sequentially receive the second digital signal DATA_R and the clock from a left end cell in the second digital circuit part DCB2 through the input port IPC to receive the second digital signal DATA_R and the clock up to an right end cell of the digital circuit part DCB2.

The digital circuit part DCB may have a very long length L in the first direction X relative to the width W in the second direction Y due to the structure of the source drive IC chip SIC. This causes the resistance of the wires through which the digital signal is transmitted in the source drive IC chip SIC to increase, and the voltage drop of the digital signal input to the digital circuit part DCB to increase as the wires are further away from the input port of the source drive IC chip SIC. As shown in FIGS. 4A and 4B, the resistance of the wires transmitting the digital signal may increase in a structure in which the transmission path of the digital signal is extended in the source drive IC chip SIC. The voltage drop of the digital signal to be input to the digital circuit part DCB may cause the sampling error of the pixel data in the digital circuit part DCB.

In the source drive IC chip SIC, the digital signal may be received through a plurality of signal wires and passed to the digital circuit part DCB. In this case, if the digital signals transmitted to the signal wires within the source drive IC chip SIC are subjected to a simultaneous transition, for example, if the logical values of the digital signals are simultaneously inverted from "L" (or "0") to "H" (or "1") or "H" (or "1") to "L" (or "0"), the amount of current in the signal wires may increase, resulting in a large voltage drop of the digital signals.

Figure 5:
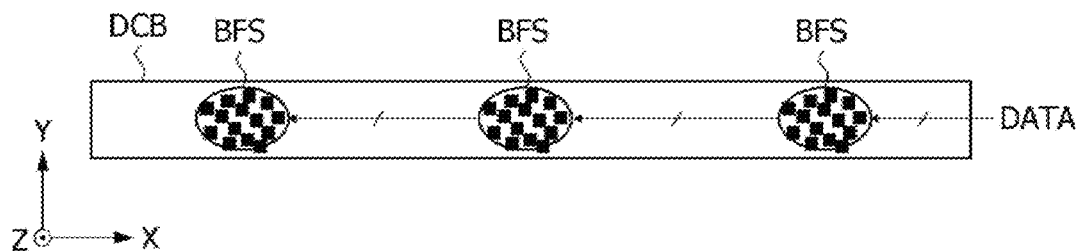
FIG. 5 is a diagram schematically illustrating one example of buffers clustered on the digital signal transmission path of the source drive IC chip.

To reduce the transmission loss of the digital signals within the source drive IC, buffers may be placed on the wires through which the digital signals are transmitted. Each of the buffers may be implemented as any known digital signal buffer. Even though multiple buffers are connected to the respective wires transmitting the digital signals, the amount of current flowing through the wires increases when the digital signals applied to the wires are subjected to a simultaneous transition, which increases the voltage drop of the digital signals. In a case where the buffers are arranged in the form of a cluster as shown in FIG. 5, when the transition of the digital signals occurs, a large voltage drop occurs whenever the digital signals pass through a plurality of clustered buffers BFS. This voltage drop increases as the wires get farther from the input port of the source drive IC chip SIC, resulting in the largest voltage drop at an end cell of the digital circuit part DCB farther from the input port.

Figure 6A:
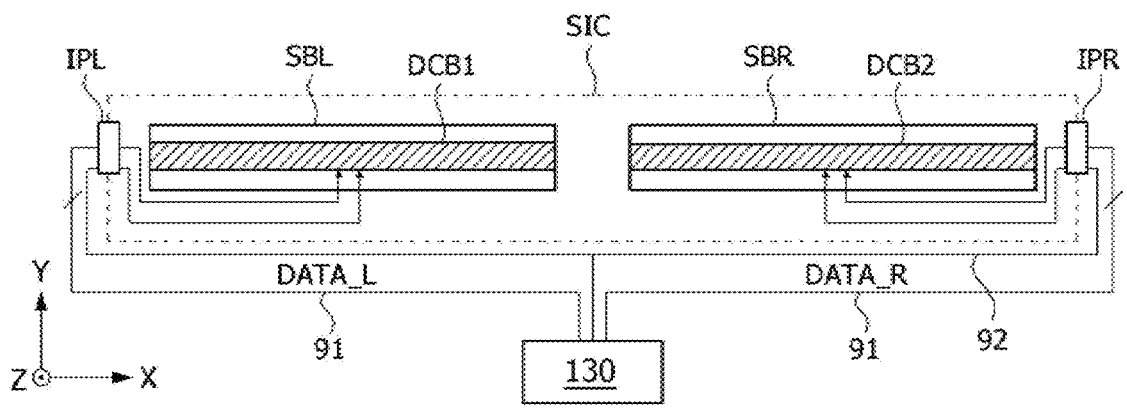
FIGS. 6A and 6B are diagrams illustrating an input port of a source drive IC chip according to another embodiment of the present disclosure.
Figure 6B:
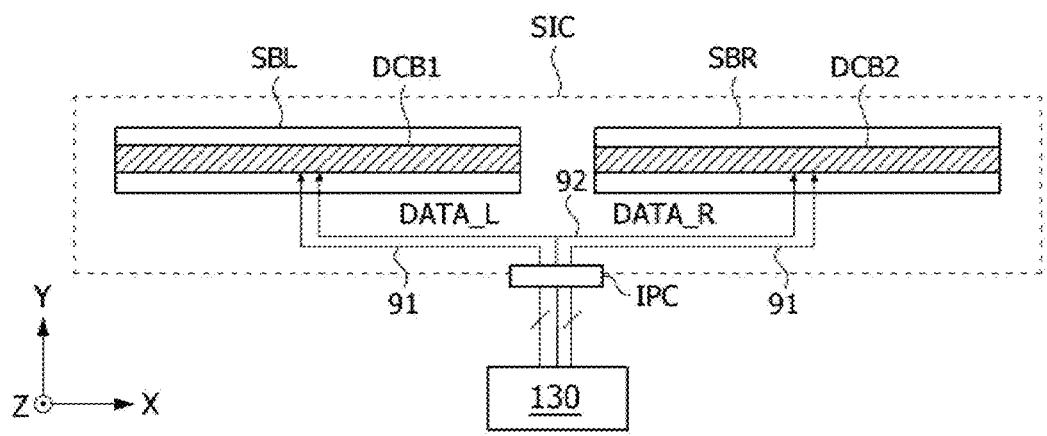

To reduce the voltage drop of the digital signal within the source drive IC chip SIC, the digital signal may be input to the center of each of the source blocks SBL and SBR, as shown in FIGS. 6A and 6B.

FIGS. 6A and 6B are diagrams illustrating an input port of a source drive IC chip according to another embodiment of the present disclosure.

Referring to FIG. 6A, the source drive IC chip SIC may include first and second input ports IPL and IPR disposed on both sides thereof. The signal wire 91 and the clock wire 92 may be connected to the center of the length direction (or first direction) of the first and second digital circuit parts DCB1 and DCB2 by way of the input ports IPL and IPR of the source drive chip SIC.

The first digital signal DATA_L and the clock are input to a center cell in the first digital circuit part DCB1 located at the center of the first source block SBL in the length direction through the first input port IPL, so that the first digital signal DATA_L and the clock are sequentially passed to the left end cell in the first digital circuit part DCB1 while being sequentially passed to the right end cell in the first digital circuit part DCB1. The second digital signal DATA_R and the clock are input to a center cell in the second digital circuit part DCB2 located at the center of the second source block SBR in the length direction through the second input port IPR, so that the second digital signal DATA_R and the clock are sequentially passed to the left end cell in the second digital circuit part DCB2 while being sequentially passed to the right end cell in the second digital circuit part DCB2. Therefore, the transmission path of the digital signals DATA_L and DATA_R and the clock received by the digital circuit parts DCB1 and DCB2 in each of the first and second source blocks SBL and SBR may be shortened to reduce the wire resistance by this amount, and the drive strength of the buffers may be lowered, resulting in the reduction of the voltage drop of the digital signals transmitted to the digital circuit parts DCB1 and DCB2.

Referring to FIG. 6B, the source drive IC chip SIC may include an input port IPC located at the center of the length in the first direction X. The signal wire 91 and clock wire 92 may be connected to the center of the length direction (or first direction) of each of the first and second digital circuit parts DCB1 and DCB2 by way of the input port IPC of the source drive chip SIC.

The first digital signal DATA_L and the clock are input to a center cell in the first digital circuit part DCB1 located at the center of the first source block SBL in the length direction through the input port IPC, so that the first digital signal DATA_L and the clock are sequentially passed to the left end cell in the first digital circuit part DCB1 while being sequentially passed to the right end cell in the first digital circuit part DCB1. The second digital signal DATA_R and the clock are input to a center cell in the second source block SBR in the length direction through the input port IPC, so that the second digital signal DATA_R and the clock are sequentially passed to the left end cell in the second digital circuit part DCB2 while being sequentially passed to the right end cell in the second digital circuit part DCB2. Therefore, the transmission path of the digital signals DATA_L and DATA_R and the clock received by the digital circuit parts DCB1 and DCB2 in each of the first and second source blocks SBL and SBR may be shortened to reduce the wire resistance by this amount, and the drive strength of the buffers may be lowered, resulting in the reduction of the voltage drop of the digital signals transmitted to the digital circuit parts.

Figure 7A:
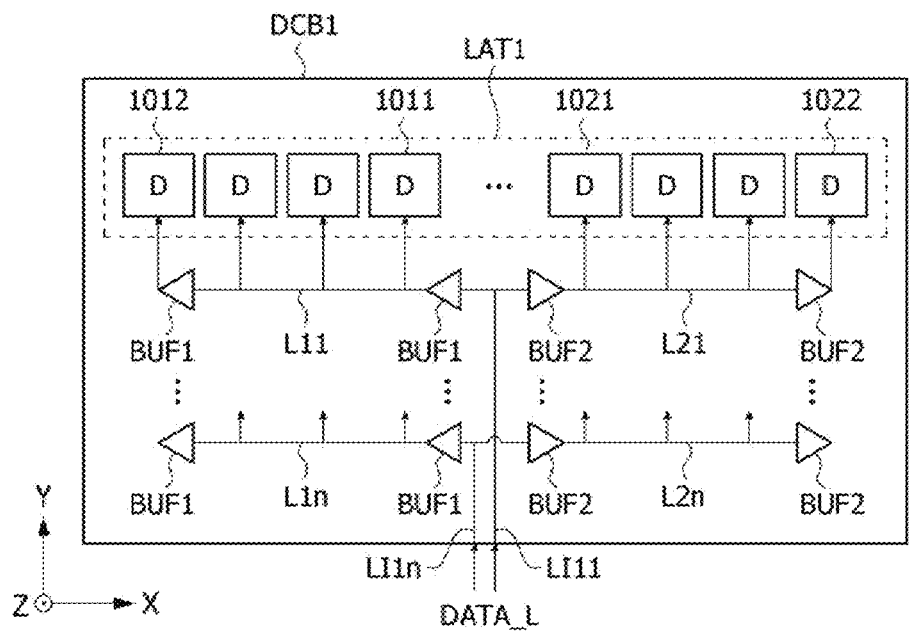
FIG. 7A is a diagram illustrating buffers connected to the signal wires on the first digital circuit part shown in FIGS. 6A and 6B.
Figure 7B:
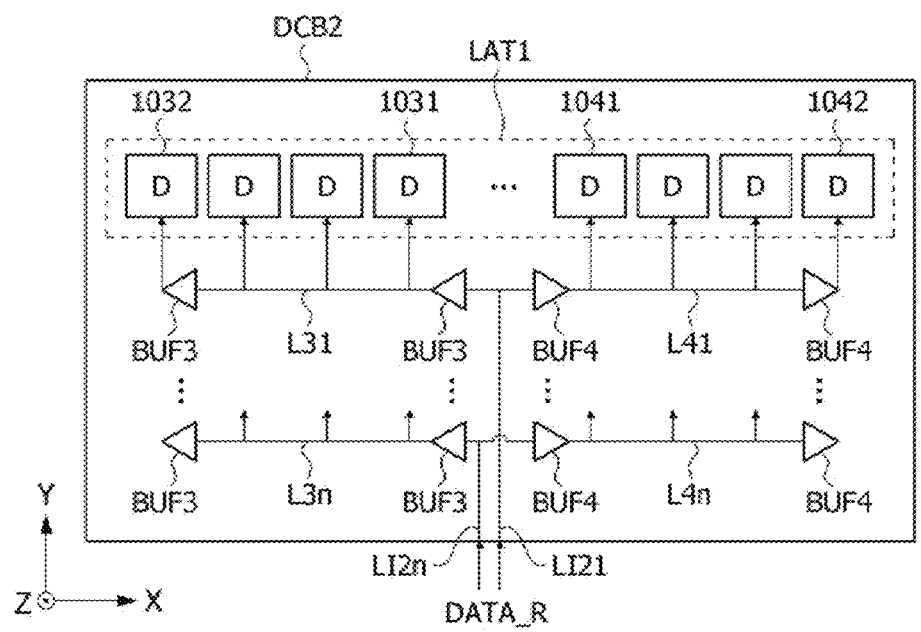
FIG. 7B is a diagram illustrating buffers connected to the signal wires on the second digital circuit part shown in FIGS. 6A and 6B.

FIG. 7A is a diagram illustrating buffers connected to the signal wires of the first digital circuit part DCB1 shown in FIGS. 6A and 6B. FIG. 7B is a diagram illustrating buffers connected to the signal wires of the second digital circuit part DCB2 shown in FIGS. 6A and 6B. In FIG. 7A and FIG. 7B, "D" denotes a cell into which bits of the digital signal are received in the first and second digital circuit parts DCB1 and DCB2. In FIGS. 7A and 7B, the clock wire is omitted.

The signal wires and the clock wire of the source drive IC chip SIC each include branch wires that branch off to opposite sides from the center in the length direction of the source blocks SBL and SBR.

Referring to FIG. 7A, the first digital circuit part DCB1 includes a plurality of cells 1011, 1012, 1021, and 1022 into which the digital signal DATA_L and the clock are received through wires L11 to L2n and buffers BUF1 and BUF2. The cells 1011, 1012, 1021, and 1022 include center cells 1011 and 1021 located at the center of the first digital circuit part DCB1, a left end cell 1012, and a right end cell 1022.

The wires L11 to L2n include a first left wire L11 branching to the left along the first direction X from a first input wire LI11, . . . , an (n)th left wire L1n (where n is a natural number greater than or equal to 2) branching to the left along the first direction X from an (n)th input wire LI1n, a first right wire L21 branching to the right along the first direction X from the first input wire LI11, . . . , and a second right wire L2n branching to the right along the first direction X from the (n)th input wire LI1n. First buffers BUF1 may be arranged to be spaced apart from each other at equal intervals in the left of the input wires LI11 to LI1n to be connected in series to the left wires L11 to L1n. The input and output terminals of the first buffers BUF1 are connected to the left wires L11 to L1n so that the digital signal may be transmitted from the right to the left. Second buffers BUF2 may be arranged to be spaced apart from each other at equal intervals in the right of the input wires LI11 to LI1n to be connected in series to the right wires L21 to L2n. The input and output terminals of the second buffers BUF2 are connected to the right wires L21 to L2n so that the digital signal may be transmitted from the left to the right. The first buffers BUF1 and the second buffers BUF2 may be arranged in a bilaterally symmetrical structure with the input wire LI11 and LI1n interposed therebetween.

In the first direction X, the digital signal DATA_L and the clock CLK may be received into the plurality of cells 1011 to 1012 through the left wires L11 to L1n between the adjacent first buffers BUF1. In the first direction X, the digital signal DATA_L and the clock CLK may be received into the plurality of cells 1021 to 1022 through the right wires L21 to L2n between the adjacent second buffers BUF2. The wires L11 to L2n may be connected to different cells in the first digital circuit part DCB1.

Referring to FIG. 7B, the second digital circuit part DCB2 includes a plurality of cells 1031, 1032, 1041, and 1042 into which the digital signal DATA_R and the clock are received through wires L31 to L4n and buffers BUF3 and BUF4. The cells 1031, 1032, 1041, and 1042 include center cells 1031 and 1041 located at the center of the second digital circuit part DCB2, a left end cell 1032, and a right end cell 1042.

The wires L31 to L4n include a first left wire L31 branching to the left along the first direction X from a first input wire LI21, . . . , an (n)th left wire L3n branching to the left along the first direction X from an (n)th input wire LI2n, a first right wire L41 branching to the right along the first direction X from the first input wire LI21, . . . , and an (n)th right wire L4n branching to the right along the first direction X from the (n)th input wire LI2n. Third buffers BUF3 may be arranged to be spaced apart from each other at equal intervals in the left of the input lines LI31 to LI3n to be connected in series to the left wires L31 to L3n. The input and output terminals of the third buffers BUF3 are connected to the left wires L31 to L3n so that the digital signal may be transmitted from the right to the left. Fourth buffers BUF4 may be arranged to be spaced apart from each other at equal intervals in the right of the input wires LI21 to LI2n to be connected in series to the right wires L41 to L4n. The input and output terminals of the fourth buffers BUF4 are connected to the right wires L41 to L4n so that the digital signal may be transmitted from the left to the right. The third buffers BUF3 and the fourth buffers BUF4 may be arranged in a bilaterally symmetrical structure with the input wires LI21 to LI2n disposed therebetween.

In the first direction X, the digital signal DATA_R and the clock CLK may be received into the plurality of cells 1031 to 1032 through the left wires L31 to L3n between the adjacent third buffers BUF3. In the first direction X, the digital signal DATA_R and the clock CLK may be received by the plurality of cells 1041 to 1042 through the right wires L41 to 42n between the adjacent fourth buffers BUF4. The wires L31 to L4n may be connected to different cells in the second digital circuit part DCB2.

Figure 8:
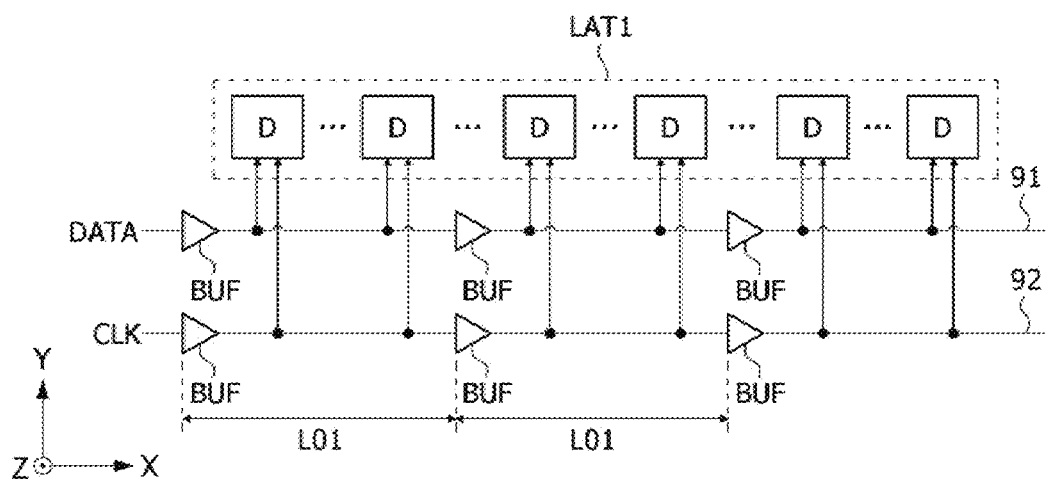
FIG. 8 is a diagram illustrating a digital signal and a clock input to the digital circuit part through wires to which the buffers are connected.
Figure 9:
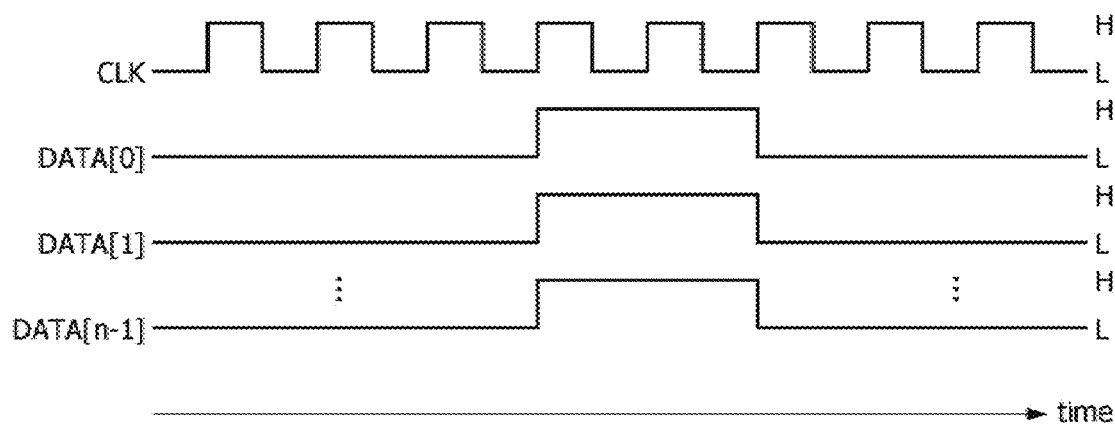
FIG. 9 is waveform diagrams illustrating one example of the digital signal and the clock input to the digital circuit part.

Referring to FIGS. 8 and 9, the source drive IC chip SIC includes the wires 91 and 92 disposed in the digital circuit part DCB and connected to cells D in the digital circuit part DCB.

The wires 91 and 92 include a plurality of signal wires 91 through which a digital signal DATA[0] to DATA[n−1] is transmitted, and a clock wire 92 through which a clock CLK is transmitted. To reduce the voltage drop caused by the clustering of the buffers BUF, the buffers BUF may be connected at equal intervals L01 to each of the wires 91 and 92.

Each of the cells D in the digital circuit part DCB may sample and latch the digital signal DATA[0] to DATA[n−1] when the clock is at a specific logic value. For example, the cells D may sample and latch the bits of the digital signal DATA[0] to DATA[n−1] input through the signal wire 91 at arising edge of the clock CLK. The cells D may sample the digital signal DATA[0] to DATA[n−1] for the time period that the clock CLK holds a high logic value (H) after the clock has risen to the high logic value (H).

Figure 10:
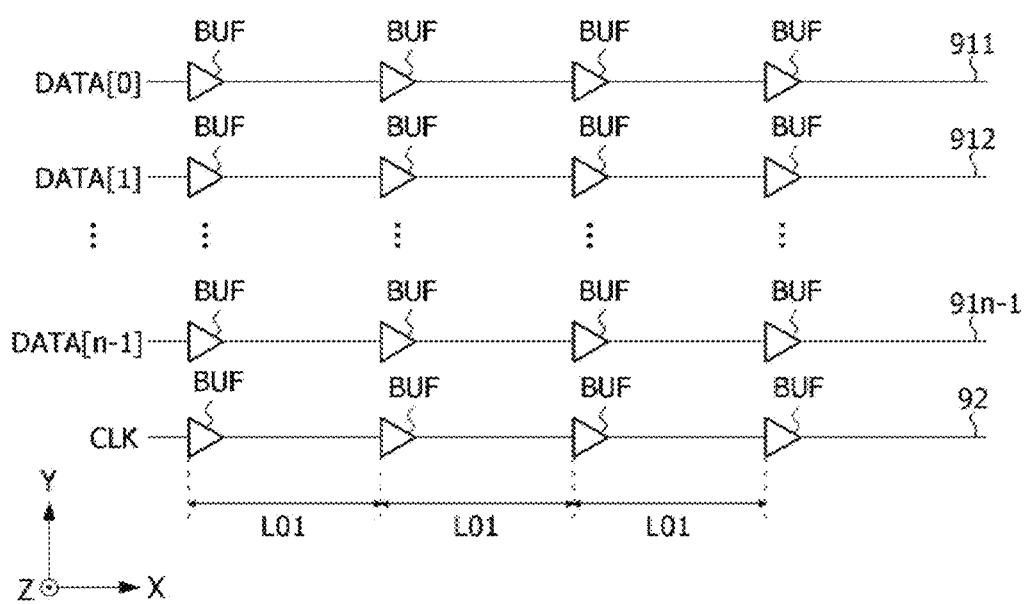
FIGS. 10 and 11 are diagrams illustrating the equidistant arrangement of the buffers in the source drive IC chip.
Figure 11:
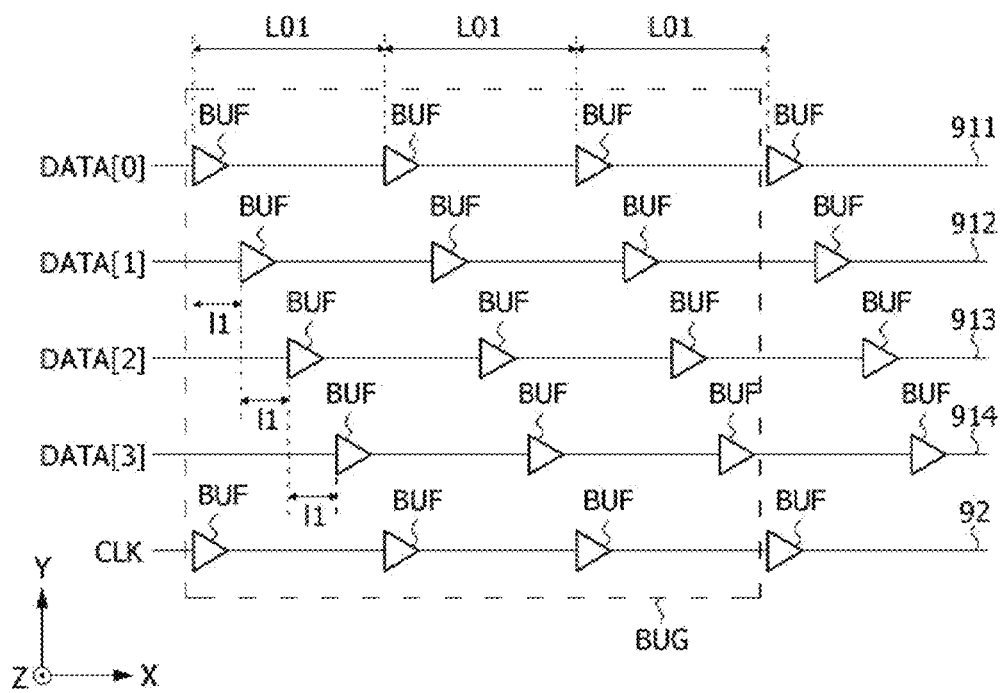

FIGS. 10 and 11 are diagrams illustrating the equidistant arrangement of the buffers in the source drive IC chip.

Referring to FIG. 10, the digital signal DATA[0] to DATA[n−1] is input to the digital circuit part DCB of the source drive IC chip through signal wires 911 to 91n-1. The clock CLK is provided to the digital circuit part DCB of the source drive IC chip through the clock wire 92. The buffers BUF are connected to the wires 911 to 91n-1 and 92 so that they are spaced at equal intervals L01.

Referring to FIG. 11, the separation distance between the buffers BUF connected in series to each of the neighboring wires 911 to 914 and 92 is an equal interval l1. Within the source drive IC chip SIC, the buffers BUF may be arranged to satisfy a condition of L01>l1. In other words, in each of the wires (911 to 914, 92), the distance (l1) between the buffers (BUF) connected to neighboring wires (911 to 914, 92) is smaller than the distance (L01) between the buffers (BUF) connected in series to one wire.

Within the source drive IC chip SIC, the buffers BUF connected to the wires 911 to 914 and 92 may be arranged in a form in which the unit block BUG of the buffers is repeated as shown in FIG. 11.

The voltage drop increases when the digital signal DATA[0] to DATA[n−1] applied to the wires 911 to 914 and 92 connected to the digital circuit part DCB are subjected to a simultaneous transition. If the transition or toggle timing of the digital signals DATA[0] to DATA[n−1] is spread out on the time axis, the amount of voltage drop may be reduced because the fewer the number of simultaneously driven buffers BUF, the smaller the dynamic IR drop.

Figure 12:
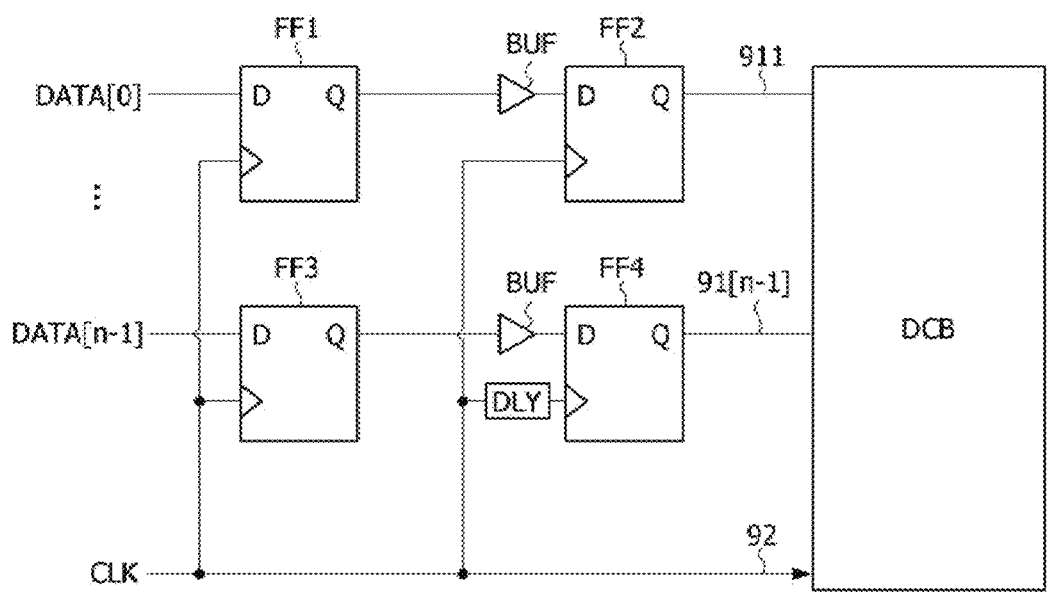
FIGS. 12 and 13 are circuit diagrams illustrating one example of a method of delaying the signal input to the digital circuit part.
Figure 13:
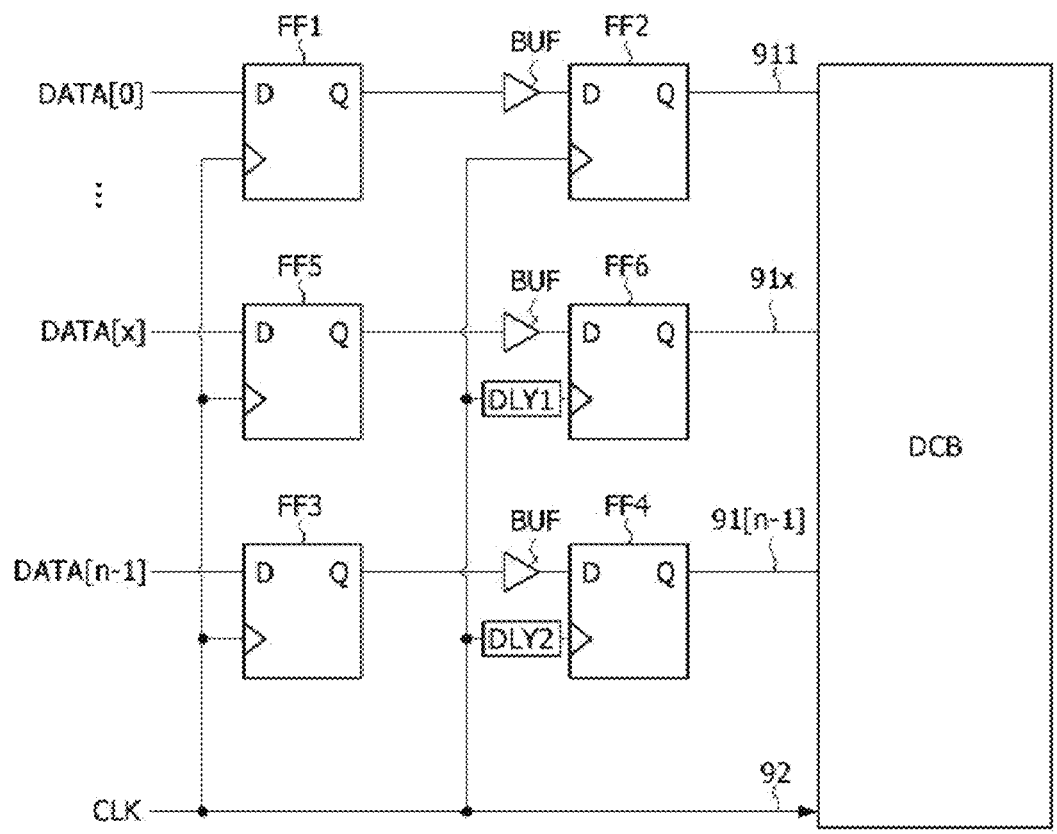

FIGS. 12 and 13 are circuit diagrams illustrating one example of a method of delaying the signal input to the digital circuit part.

Referring to FIGS. 12 and 13, the source drive IC chip SIC may further include a plurality of flip-flops FF1 to FF6 connected to the signal wires 911 to 91*n*–1, and delay circuits DLY, DLY1, and DLY2 connected to a clock terminal of at least one flip-flop FF4. One or more buffers may be connected to the wire between the adjacent flip-flops FF1 to FF6.

The flip-flops FF1 to FF6 and the delay circuits DLY, DLY1, and DLY2 may be arranged in the digital circuit part DCB or outside the digital circuit part DCB. The flip-flops FF1 to FF6 are connected to the wires 911 to 91*n*–1 to receive the digital signal DATA[0] to DATA[n–1] and the clock CLK, which are input through the wires 911 to 91*n*–1. The clock CLK is commonly input to the clock terminals of the flip-flops FF1 to FF6. Each of the flip-flops FF1 to FF6 outputs the digital signal DATA[0] to DATA[n–1] latched at a rising edge at which the clock is inverted to the high logic value.

Figure 14:
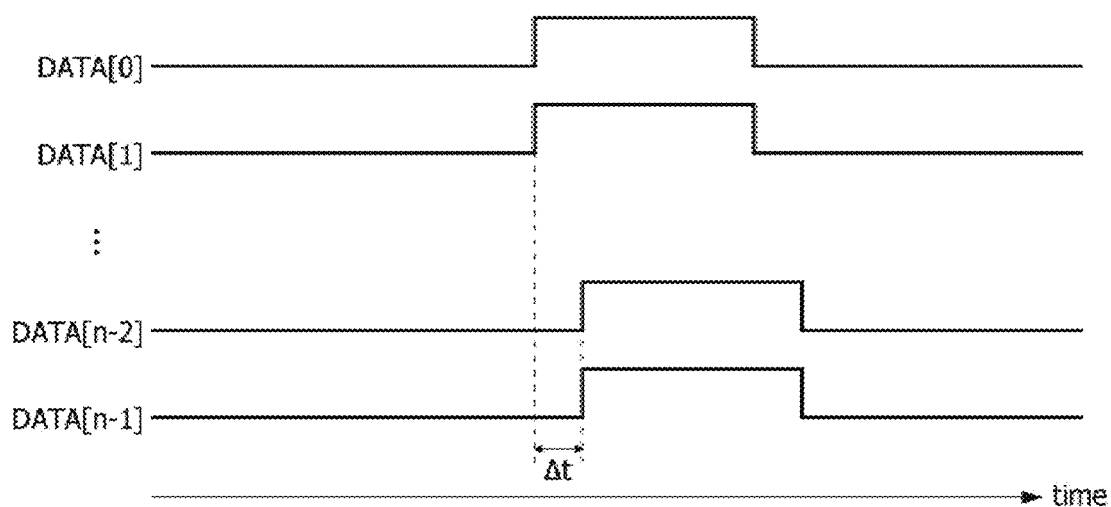
FIGS. 14 and 15 are waveform diagrams illustrating an example in which some signals input to the digital circuit unit are delayed.
Figure 15:
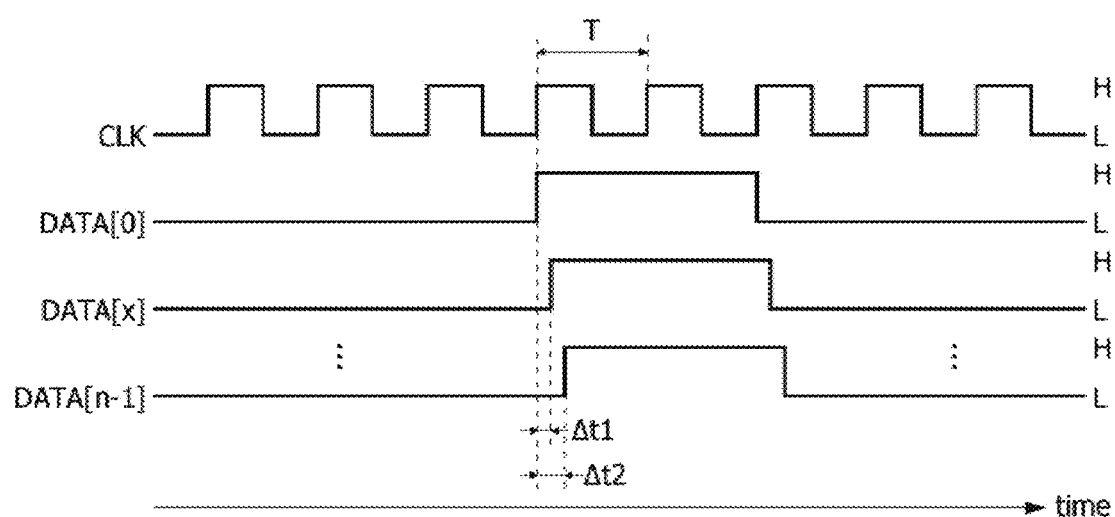

The delay circuits DLY and DLY2, and DLY1 are connected between the clock terminal of the flip-flop FF4 and FF6 and the clock wire 92 to delay the clock CLK, causing clock skew. The delay circuits may be implemented as an RC delay circuit, but is not limited thereto. Accordingly, the flip-flops FF4 and FF6 connected to the delay circuits DLY and DLY2, and DLY1 output signal signals DATA[n–1] and DATA[x] in response to the delayed clock CLK. As a result, the timing of the transitions or toggles of the digital signal DATA[0] to DATA[n–1]transmitted through the wires 911 to 91*n*–1 may be spread out on the time axis as shown in FIGS. 14 and 15. In FIGS. 14 and 15, "Δt", "Δt1", and "Δt2" are the delay times.

As shown in FIG. 13, the delay circuits DLY1 and DLY2 may be connected to the plurality of flip-flops FF6 and FF4. The delay circuits DLY1 and DLY2 may be set to different delay values. For example, the delay value of the second delay circuit DLY2 may be larger than the delay value of the first delay circuit DLY1. In this case, the delay time Δt2 of the digital signal DATA[n–1] delayed by the second delay circuit DLY2 may be greater than the delay time Δt1 of the digital signal DATA[x] delayed by the first delay circuit DLY1, as shown in FIG. 15. The maximum delay should be within the high logic period (H) of the clock CLK within one cycle T of the clock CLK, for example, as shown in FIG. 15.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure.

What is claimed is:

1. A source drive integrated circuit (IC) comprising:
one or more digital circuit parts configured to receive a digital signal;
a plurality of signal wires connected to the one or more digital circuit parts and configured to transmit the digital signal to the digital circuit parts; and
a clock wire connected to the one or more digital circuit parts and configured to transmit a clock to the one or more digital circuit parts,
wherein each of the plurality of signal wires and the clock wire includes:
an input wire located at a center in a length direction of the one or more digital circuit parts; and
branch wires branching off to both sides of the input wire along the length direction of the one or more digital circuit parts.

2. The source drive IC of claim 1, further comprising:
a plurality of buffers connected in series at equal intervals to the each of the plurality of signal wires and the clock wire.

3. The source drive IC of claim 2, further comprising:
a plurality of flip-flops connected to the each of the plurality of signal wires; and
a delay circuit connected to a clock terminal of at least one of the plurality of flip-flops.

4. The source drive IC of claim 2, wherein the plurality of buffers are arranged in bilateral symmetry on the branch wires based on the input wire.

5. The source drive IC of claim 4, further comprising:
a plurality of flip-flops connected to the each of the plurality of signal wires; and
a delay circuit connected to a clock terminal of at least one of the plurality of flip-flops.

6. The source drive IC of claim 5, further comprising:
a buffer connected between the plurality of flip-flops.

7. The source drive IC of claim 6, further comprising:
a first flip-flop connected to a first signal wire;
a first delay circuit connected to a clock terminal of the first flip-flop;
a second flip-flop connected to a second signal wire; and
a second delay circuit connected to a clock terminal of the second flip-flop,
wherein a delay value of the first delay circuit is different from a delay value of the second delay circuit.

8. The source drive IC of claim 2, wherein in the each of the plurality of signal wires, a distance between the plurality of buffers connected to neighboring wires is smaller than a distance between the plurality of buffers connected in series to one wire.

9. A display device comprising:
a display panel having a plurality of data lines and a plurality of pixels arranged thereon; and
a source drive integrated circuit (IC) configured to supply data voltages to the data lines,
wherein the source drive IC includes:
a digital circuit part configured to receive a digital signal;
a plurality of signal wires connected to the digital circuit part and configured to transmit the digital signal to the digital circuit part; and
a clock wire connected to the digital circuit part and configured to transmit a clock to the digital circuit part, and
wherein each of the plurality of signal wires and the clock wire includes:
an input wire located at a center in a length direction of the digital circuit part; and branch wires branching off to both sides of the input wire along the length direction of the digital circuit part.

10. The display device of claim 9, wherein:
the source drive IC further includes a plurality of buffers connected in series at equal intervals to the each of the plurality of signal wires and the clock wire.

11. The display device of claim 10, wherein the source drive IC further comprises:
a plurality of flip-flops connected to the each of the plurality of signal wires; and
a delay circuit connected to a clock terminal of at least one of the plurality of flip-flops.

12. The display device of claim 10, wherein the plurality of buffers are arranged in bilateral symmetry on the branch wires based on the input wire.

13. The display device of claim 12, wherein the source drive IC further comprises:
a plurality of flip-flops connected to the each of the plurality of signal wires; and
a delay circuit connected to a clock terminal of at least one of the plurality of flip-flops.

14. The display device of claim 13, further comprising:
a buffer connected between the plurality of flip-flops.

15. The display device of claim 10, wherein in the each of the plurality of signal wires, a distance between the plurality of buffers connected to neighboring wires is smaller than a distance between the plurality of buffers connected in series to one wire.

* * * * *